(12) United States Patent
Tian et al.

(10) Patent No.: US 12,439,776 B2
(45) Date of Patent: *Oct. 7, 2025

(54) DISPLAY PANEL AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Zheng Liu, Beijing (CN); Liangjian Li, Beijing (CN); Dong Li, Beijing (CN); Meng Zhao, Beijing (CN); Long Han, Beijing (CN); Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/221,420

(22) Filed: Jul. 13, 2023

(65) Prior Publication Data
US 2023/0363220 A1 Nov. 9, 2023

Related U.S. Application Data

(63) Continuation of application No. 16/624,286, filed as application No. PCT/CN2019/083516 on Apr. 19, 2019, now Pat. No. 11,751,442.

(30) Foreign Application Priority Data

Apr. 26, 2018 (CN) .......................... 201810384797.8

(51) Int. Cl.
*H10K 59/121* (2023.01)
*G09G 3/3266* (2016.01)
(Continued)

(52) U.S. Cl.
CPC ....... *H10K 59/1213* (2023.02); *G09G 3/3266* (2013.01); *G09G 3/3275* (2013.01);
(Continued)

(58) Field of Classification Search
CPC .............. G09G 3/3275; G09G 3/3266; G09G 2300/0426; H10K 59/131; H10K 59/124;
(Continued)

(56) References Cited

U.S. PATENT DOCUMENTS 6,900,470 B2 5/2005 Kobayashi et al.
7,474,375 B2 1/2009 Kwak et al.
(Continued)

FOREIGN PATENT DOCUMENTS

CN 1668152 A 9/2005
CN 1670570 A 9/2005
(Continued)

OTHER PUBLICATIONS

Chinese Office Action dated May 26, 2020, from application No. 201810384797.8.
(Continued)

*Primary Examiner* — Sue A Purvis
*Assistant Examiner* — Aneta B Cieslewicz
(74) *Attorney, Agent, or Firm* — XSENSUS LLP

(57) ABSTRACT

A display panel and a display device are provided. The display panel has a display area. The display panel includes: a base substrate; a driving circuit and at least one signal line on the base substrate; and at least one insulating layer between the driving circuit and the at least one signal line. The driving circuit is disposed in a periphery of the display area; and an orthogonal projection of at least one of the signal lines on the base substrate has an overlapping area with an orthogonal projection of the driving circuit on the base substrate.

11 Claims, 13 Drawing Sheets

(51) Int. Cl.
   *G09G 3/3275* (2016.01)
   *H10D 86/01* (2025.01)
   *H10D 86/40* (2025.01)
   *H10D 86/60* (2025.01)
   *H10K 59/12* (2023.01)
   *H10K 59/124* (2023.01)
   *H10K 59/131* (2023.01)
   *H10K 59/80* (2023.01)
   *H10K 77/10* (2023.01)
   *H10K 102/00* (2023.01)

(52) U.S. Cl.
   CPC ......... *H10K 59/124* (2023.02); *H10K 59/131* (2023.02); *H10K 77/111* (2023.02); *H10D 86/0231* (2025.01); *H10D 86/411* (2025.01); *H10D 86/441* (2025.01); *H10D 86/451* (2025.01); *H10D 86/60* (2025.01); *H10K 59/1201* (2023.02); *H10K 59/8731* (2023.02); *H10K 2102/311* (2023.02); *Y02E 10/549* (2013.01)

(58) Field of Classification Search
   CPC ..... H10K 59/1213; H10K 59/12–1315; H10K 77/10–111; H10K 2102/311; H10K 59/8731; H10K 50/8445; H01L 27/124–1244; H01L 27/1248; H01L 27/1218; H01L 27/1214–1296; H01L 51/0097; H01L 2251/5338; Y02E 10/549; H10D 86/40–60; H10D 86/021–0251; H10D 86/441
   See application file for complete search history.

(56) References Cited

U.S. PATENT DOCUMENTS

| | | | |
|---|---|---|---|
| 8,026,667 B2 | 9/2011 | Kwak et al. | |
| 8,247,968 B2 | 8/2012 | Kwak et al. | |
| 10,170,534 B1 | 1/2019 | Kim et al. | |
| 2002/0158835 A1 | 10/2002 | Kobayashi et al. | |
| 2005/0195355 A1 | 9/2005 | Kwak et al. | |
| 2005/0200270 A1 | 9/2005 | Kwak et al. | |
| 2011/0298391 A1 | 12/2011 | Kwak et al. | |
| 2017/0358641 A1* | 12/2017 | Park | H10K 59/131 |
| 2019/0148469 A1 | 5/2019 | Lhee et al. | |
| 2019/0165333 A1* | 5/2019 | Harada | H01L 27/1244 |
| 2019/0237533 A1 | 8/2019 | Kim et al. | |
| 2020/0176545 A1 | 6/2020 | Choi et al. | |
| 2020/0312248 A1* | 10/2020 | Shin | G09G 3/3291 |
| 2021/0118971 A1* | 4/2021 | Wakata | H10K 77/111 |

FOREIGN PATENT DOCUMENTS

| | | |
|---|---|---|
| CN | 1858911 A | 11/2006 |
| CN | 101354510 A | 1/2009 |
| CN | 102270413 A | 12/2011 |
| CN | 102473367 A | 5/2012 |
| CN | 204464282 U | 7/2015 |
| CN | 104835828 A | 8/2015 |
| CN | 105552083 A | 5/2016 |
| CN | 108598118 A | 9/2018 |
| EP | 1575090 A2 | 9/2005 |
| EP | 1575090 A3 | 11/2008 |
| EP | 1575090 B1 | 2/2012 |
| JP | 864-61051 A | 3/1989 |
| JP | 2003-271075 A | 9/2003 |
| JP | 2009-175389 A | 8/2009 |

OTHER PUBLICATIONS

International Search Report and Written Opinion dated Jul. 24, 2019, from application No. PCT/CN2019/083516.
Second Office Action for CN Patent Application No. 201810384797.8 mailed Apr. 2, 2021.
Non-Final Office Action mailed Feb. 18, 2021, for U.S. Appl. No. 16/624,286, filed Dec. 18, 2019, 12 pages.
Final Office Action mailed Jul. 27, 2021, for U.S. Appl. No. 16/624,286, filed Dec. 18, 2019, 17 pages.
Non-Final Office Action mailed Mar. 2, 2022, for U.S. Appl. No. 16/624,286, filed Dec. 18, 2019, 16 pages.
Final Office Action mailed Aug. 11, 2022, for U.S. Appl. No. 16/624,286, filed Dec. 18, 2019, 14 pages.
Notice of Allowance mailed Apr. 17, 2023, for U.S. Appl. No. 16/624,286, filed Dec. 18, 2019, 9 pages.
Decision of Rejection dated Jun. 28, 2021, from CN Application No. 201810384797.8, 10 pages including English Translation.
Notification of Re-examination dated Jan. 10, 2022, from CN Application No. 201810384797.8, 10 pages including English Translation.
Decision of Re-examination dated Mar. 14, 2022, from CN Application No. 201810384797.8, 19 pages including English Translation.

* cited by examiner

DISPLAY PANEL AND DISPLAY DEVICE

CROSS-REFERENCE TO RELATED APPLICATIONS

This application is a continuation application of U.S. application Ser. No. 16/624,286, filed Dec. 18, 2019, which is the national phase of PCT Application No. PCT/CN2019/083516, filed on Apr. 19, 2019, which is based upon and claims the priority of the Chinese Patent Application No. 201810384797.8, entitled "DISPLAY PANEL AND DISPLAY DEVICE", filed with the Chinese Patent Office on Apr. 26, 2018, the entire contents of each are hereby incorporated by reference for all purposes.

TECHNICAL FIELD

The present disclosure relates to the field of display technologies, in particular, relates to a display panel and a display device.

BACKGROUND

With the continuous development of narrow bezel and full screen design, an area of a periphery of a display panel corresponding to a bezel is getting smaller and smaller, so that a wiring density in the display panel is getting higher and higher. In this case, in order to avoid short circuit, requirements on the manufacturing process of the display panel are also getting higher and higher.

SUMMARY

In a first aspect, a display panel is provided. The display panel has a display area. The display panel includes: a base substrate; a driving circuit and at least one signal line on the base substrate; and at least one insulating layer between the driving circuit and the at least one signal line. The driving circuit is disposed in a periphery of the display area; and an orthogonal projection of at least one of the signal lines on the base substrate has an overlapping area with an orthogonal projection of the driving circuit on the base substrate.

In some arrangements, the display panel further includes: a plurality of light emitting devices disposed in the display area. The at least one signal line is at least one electrode power supply line, and a first electrode of each of the plurality of light emitting devices is coupled to at least one of the electrode power supply lines. The first electrode is an electrode of the light emitting device away from the base substrate.

In some arrangements, the first electrodes of all the light emitting devices are connected to each other to form an electrode layer, and all of the electrode power supply lines are coupled to the electrode layer.

In some arrangements, the number of the electrode power supply lines is one and the electrode power supply line is disposed at three sides of the electrode layer. The driving circuit is disposed along at least one of the three sides.

In some arrangements, for any of the electrode power supply lines of which the orthogonal projection on the base substrate has an overlapping area with the orthogonal projection of the driving circuit on the base substrate, the electrode power supply line is provided with at least one opening, and an orthogonal projection of at least one of the openings on the base substrate has an overlapping area with an orthogonal projection of at least one metal portion of the driving circuit on the base substrate.

In some arrangements, the number of the openings is more than one, and the orthogonal projection of each of the openings on the base substrate and the orthogonal projection of at least one of the metal portions on the base substrate have an overlapping area.

In some arrangements, the driving circuit includes a plurality of transistors. A gate electrode of each of the transistors is taken as one metal portion, a source electrode of each of the transistors is taken as one metal portion, and a drain electrode of each of the transistors is taken as one metal portion. One of the openings corresponds to at least one of the gate electrode, the source electrode and the drain electrode of at least one of the transistors.

In some arrangements, the driving circuit includes at least one metal trace, and one of the metal traces is taken as one metal portion. One of the openings corresponds to at least a portion of at least one of the metal traces.

In some arrangements, at least one of the metal traces corresponds to a plurality of the openings. A total size of the overlapping area of the orthographic projection of the plurality of openings corresponding to the same metal trace on the base substrate and the orthographic projection of that metal trace on the base substrate, is larger than or equal to 20% of the area of the orthogonal projection of that metal trace on the base substrate.

In some arrangements, the total size of the overlapping area of the orthographic projection of the plurality of openings corresponding to the same metal trace on the base substrate and the orthographic projection of that metal trace on the base substrate, is equal to 80% or 90% of the area of the orthogonal projection of that metal trace on the base substrate.

In some arrangements, the driving circuit, the at least one insulating layer, and the at least one electrode power supply line are sequentially stacked on the base substrate.

In some arrangements, the at least one insulating layer includes an organic insulating layer and/or an inorganic insulating layer.

In some arrangements, the at least one insulating layer includes an organic insulating layer and an inorganic insulating layer. The inorganic insulating layer is disposed adjacent to the driving circuit, and the organic insulating layer is disposed adjacent to the at least one signal line.

In some arrangements, the organic insulating layer has a thickness larger than a thickness of the inorganic insulating layer.

In some arrangements, the driving circuit has a first region and a second region outside the first region. A metal portion of the driving circuit is disposed within the first region. The whole insulating layer corresponds to the first region. Or, the whole insulating layer correspond to the first region and the second region, and a thickness of the portion of the whole insulating layer corresponding to the first region is larger than a thickness of the portion of the whole insulating layer corresponding to the second region.

In some arrangements, the base substrate is a flexible substrate.

In a second aspect, a display device is provided, including the display panel of any one of the above.

BRIEF DESCRIPTION OF THE DRAWINGS

In order to more clearly illustrate technical solutions in some arrangements of the present disclosure or in the related art, the drawings used in some arrangements of the present disclosure or description of related art will be briefly described below. Apparently, the drawings in the following description is merely some arrangements of the present disclosure, and other drawings may be obtained from these drawings by those skilled in the art without paying creative efforts.

DETAILED DESCRIPTION

In order to make the objectives, technical solutions and advantages of the arrangements of the present disclosure clearer, the technical solutions in the arrangements of the present disclosure will be clearly and completely described in conjunction with the drawings in the arrangements of the present disclosure. Apparently, the described arrangements are part of the arrangements of the present disclosure, and not all of the arrangements. All other arrangements obtained by those of ordinary skill in the art based on the arrangements of the present disclosure without paying creative efforts fall within the protective scope of the present disclosure.

Figure 1:
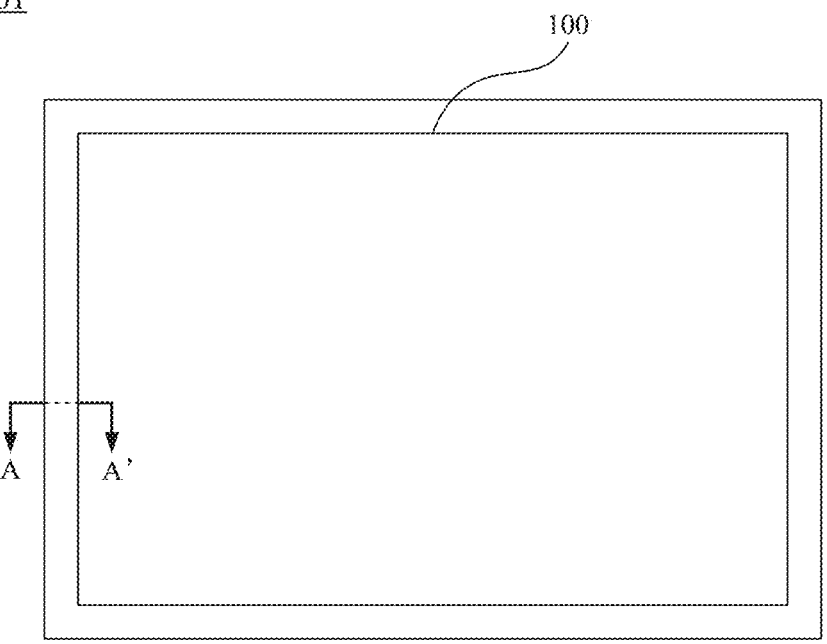
FIG. 1 is a schematic top plan view of a display panel according to some arrangements of the present disclosure.
Figure 2:
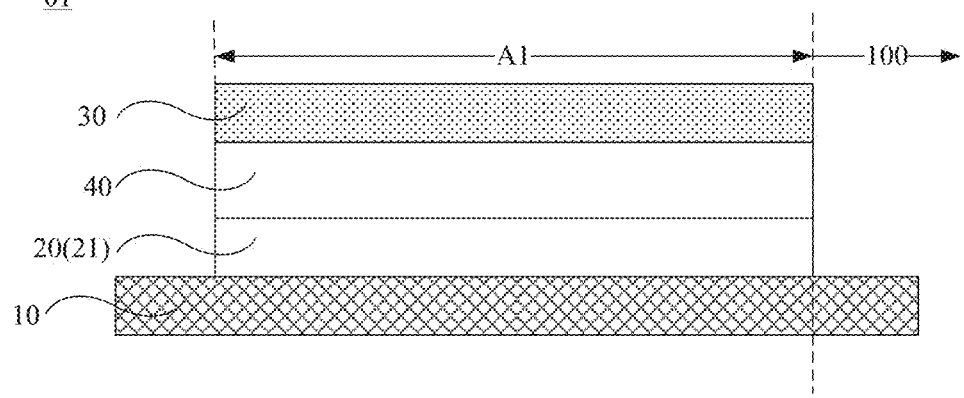
FIG. 2 is a cross-sectional view of a display panel according to some arrangements of the present disclosure.

Some arrangements of the present disclosure provide a display panel 01 having a display area 100 as shown in FIG. 1. As shown in FIG. 2, the display panel 01 includes: a base substrate 10; a driving circuit 20 on the base substrate 10 and at least one signal line 30; and at least one insulating layer 40 between the driving circuit 20 and the at least one signal line 30.

The driving circuit 20 is disposed in the periphery of the display area 100, and an orthogonal projection of the at least one signal line 30 on the base substrate 10 and an orthogonal projection of the driving circuit 20 on the base substrate 10 have an overlapping area A1.

It can be understood that the display area 100 is an effective display area (Active Area) for the whole display panel, and thus may also be referred to as an AA area. In FIG. 1, as an example, one display panel 01 has only one display area 100, and the display area 100 is not connected to each edge of the display panel 01. Some arrangements of the present disclosure are not limited thereto, and one display panel 01 may also have a plurality of (i.e., two or more) display areas 100 spaced apart from each other, and/or one display area 100 may extend to one or two opposite edges of the display panel 01.

Here, the base substrate 10, the driving circuit 20, the signal line 30, and the insulating layer 40 are illustrated in FIG. 2, and the cross-sectional direction of FIG. 2 corresponds to the A-A' direction in FIG. 1.

In FIG. 2, as an example, only the driving circuit 20, the at least one insulating layer 40, and the at least one signal line 30 are sequentially stacked on the base substrate 10. Some arrangements of the present disclosure are not limited thereto, and the configurations of the above structures may be: at least one signal line 30, at least one insulating layer 40, and the driving circuit 20 are sequentially stacked on the base substrate 10.

Further, as long as the orthogonal projection of the at least one signal line 30 on the base substrate 10 and the orthogonal projection of the driving circuit 20 on the base substrate 10 have an overlapping area A1, and the size of the overlapping area A1 is not limited.

It can also be understood that, take the structure of the display panel 01 illustrated in FIG. 2 as an example, other layers may also be disposed between the base substrate 10 and the driving circuit 20 in the display panel 01 according to actual needs. For example, the display panel 01 may further include a buffer layer between the base substrate 10 and the driving circuit 20.

Since the manufacturing process of the driving circuit 20 includes a high-temperature process, the buffer layer can prevent the impurity ions in the base substrate 10 from being migrated into the driving circuit 20 by the high-temperature process, thus improving the yield rate of the display panel 01.

Of course, when the above structures are arranged in such a manner that at least one signal line 30, at least one insulating layer 40, and the driving circuit 20 are sequentially stacked on the base substrate 10, other layers, for example, the above-mentioned buffer layer, may be provided between the base substrate 10 and at least one signal line 30 according to actual needs, and detailed description thereof will not be described.

By having the orthogonal projection of at least one signal line 30 on the base substrate 10 and the orthogonal projection of the driving circuit 20 on the base substrate 10 have an overlapping area A1, the utilization of the peripheral area of the display area 100 can be improved, thus, on the one hand, the wiring space in the periphery of the display area 100 can be further compressed, on the other hand, it is not necessary to increase the wiring density of the driving circuit 20 itself, thus solving the problem of high wiring density under the narrow bezel design requirements.

For example, the driving circuit 20, for example, electronic components such as switches and capacitors in the driving circuit 20, may be firstly fabricated on the base substrate 10, and then at least one insulating layer 40 may be formed on the base substrate 10 on which the driving circuit 20 is formed; thereafter, the signal line 30 is formed at least in the area where the insulating layer 40 is covered with the driving circuit 20.

In this way, the electronic components in the driving circuit 20 are disposed in a different layer from the layer of the signal line 30 and got insulated, so that the signal line 30 can be prevented from occupying the wiring space in the periphery of the driving circuit 20, thus further compressing the wiring space in the periphery of the display area 100. Moreover, it is not necessary to increase the wiring density of the driving circuit 20 itself.

Figure 3A:
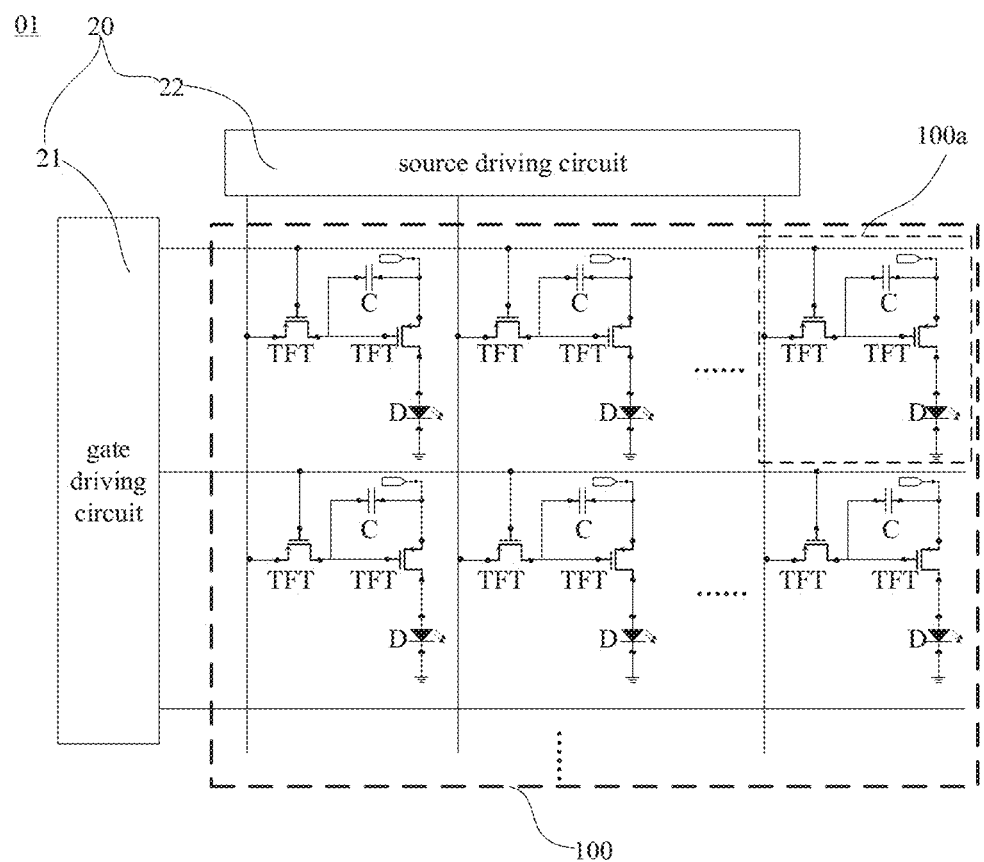
FIG. 3a is a schematic structural diagram of a display panel according to some arrangements of the present disclosure.
Figure 3B:
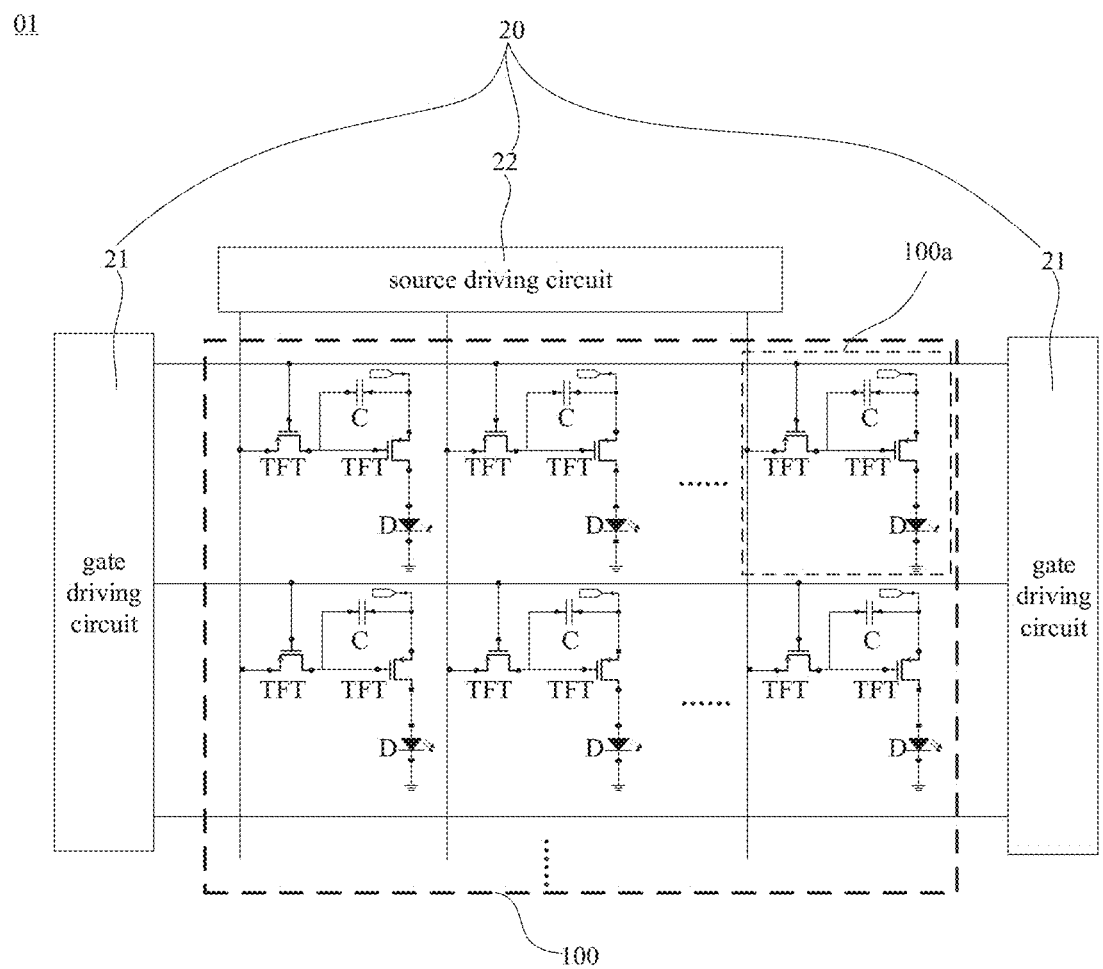
FIG. 3b is a schematic structural diagram of a display panel according to some arrangements of the present disclosure.

In some arrangements of the present disclosure, as shown in FIG. 3a or 3b, the display panel 01 further includes a plurality of light emitting devices 50 disposed in the display area 100.

The base substrate 10 in the display panel 01 may be a rigid substrate such as a glass substrate or a hard resin substrate; or the base substrate 10 may be a flexible substrate such as a flexible resin substrate.

Figure 4:
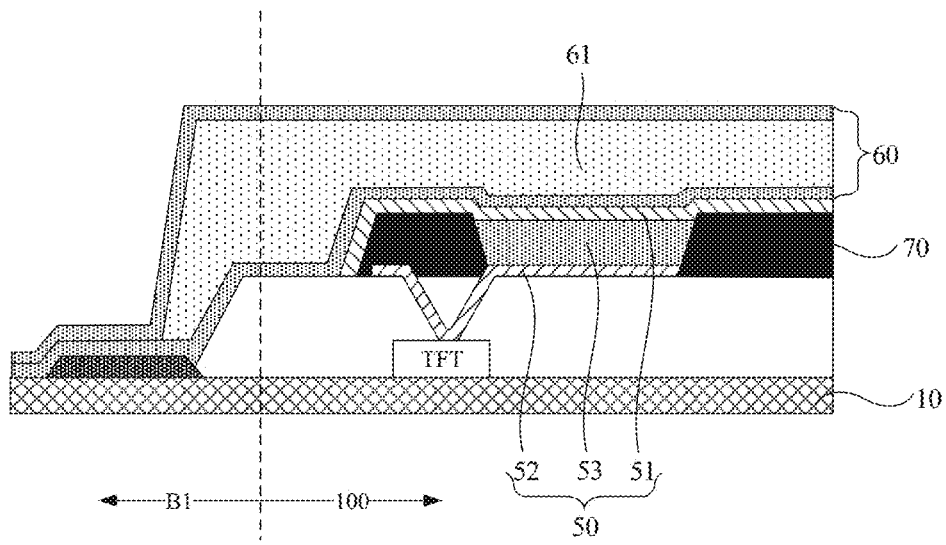
FIG. 4 is a cross-sectional view of another display panel according to some arrangements of the present disclosure.

When the base substrate 10 is a flexible substrate, as shown in FIG. 4, the plurality of light emitting devices 50 in the display area 100 may be packaged by a Thin Film Encapsulation (TFE) process, that is, a TFE layer 60 is covered on the plurality of light emitting devices 50.

In this case, the display panel 01 is a flexible display panel.

For example, the partial area disposed in the periphery of the display area 100 may be the bending area B1, and the bending area B1 may include, for example, the overlapping area A1 described above.

In this way, by bending the bending area B1 in a direction away from the display area 100, the size of the bezel can be reduced, which is advantageous for realizing the full screen design of the display panel 01.

As shown in FIG. 3a or FIG. 3b, the display panel 01 may further include: a plurality of sub-pixels 100a arranged in an array in the display area 100, and each of the sub-pixels 100a includes: a pixel circuit.

For example, each of the pixel circuits may include at least one Thin Film Transistor (TFT), at least one capacitor, and one above-described light emitting device 50.

Here, in FIG. 3a or FIG. 3b, the structure of each pixel circuit is 2T1C, that is, each pixel circuit includes: two TFTs and one capacitor C, but some arrangements of the present disclosure are not limited thereto, and the number of thin film transistors TFTs and capacitors C in each pixel circuit can be determined according to actual needs.

The light emitting device 50 may be a Light Emitting Diode (LED) or an Organic Light Emitting Diode (OLED).

The OLED device, as a current-type light emitting device, are increasingly used in high-performance display fields because of their advantages of self-luminescence, fast response, wide viewing angle, and capability of being fabricated on flexible substrates. Therefore, the above-described light emitting device 50 may be an OLED device as an example, and accordingly, the above display panel 01 is an OLED display panel.

For example, as shown in FIG. 4, the above-described light emitting device includes a first electrode 51 and a second electrode 52 disposed opposite to each other, and a light emitting layer 53 interposed therebetween.

The first electrode 51 is an electrode away from the base substrate 10 in the light emitting device, that is, the first electrode 51 is disposed farther away from the base substrate 1010 than the second electrode 52.

Therefore, generally, the first electrode is also referred to as an upper electrode, and the second electrode is also referred to as a lower electrode.

For example, the first electrode 51 may be a cathode, and the second electrode 52 may be an anode. Alternatively, the first electrode 51 may be an anode, and the second electrode 52 may be a cathode.

The light-emitting principle of the above-mentioned light emitting device is that, under the driving of an applied voltage, the positively charged holes excited from the anode and the negatively charged electrons excited from the cathode recombine in the light emitting layer, thus releasing energy and causing the molecules of the light emitting material in the light emitting layer to generate light emission.

Hereinafter, for convenience of explanation, as an example, the first electrode 51 is a cathode and the second electrode 52 is an anode.

It can be seen from the above description that each of the sub-pixels 100a includes a light emitting device 50. By driving the light emitting device 50 to emit light of a corresponding color, each of the sub-pixels 100a can display a corresponding color to realize the display function of the display panel 01.

Therefore, in order to achieve different data voltages supplied to the second electrodes 52 of the light emitting devices 50 disposed in the different sub-pixels 100a, the second electrodes 52 of the respective light emitting devices 50 may be block-shaped and insulated from each other.

For example, as shown in FIG. 4, the second electrodes 52 of two adjacent light emitting devices 50 may be spaced apart by a Pixel Defined Layer (PDL) 70.

Since the second electrodes 52 in the different light emitting devices 50 are configured to receive different data voltages, the first electrodes 51 in the different light emitting devices 50 need only receive a reference voltage. That is, the same voltage may be applied to the first electrodes 51 in the different light emitting devices 50.

Therefore, the at least one signal line may be at least one electrode power supply line (Voltage Series, VSS), and the first electrode 51 of each of the plurality of light emitting devices 50 is coupled to one electrode power supply line to receive the same voltage.

Of course, the signal line may be another trace. In the following arrangements, only the signal line as the electrode power supply line VSS is used as an example for illustration.

In this case, the first electrodes 51 of all the light emitting devices 50 may be connected to each other to form an entire electrode layer, and all of the electrode power supply lines are coupled to the electrode layer.

Figure 5:
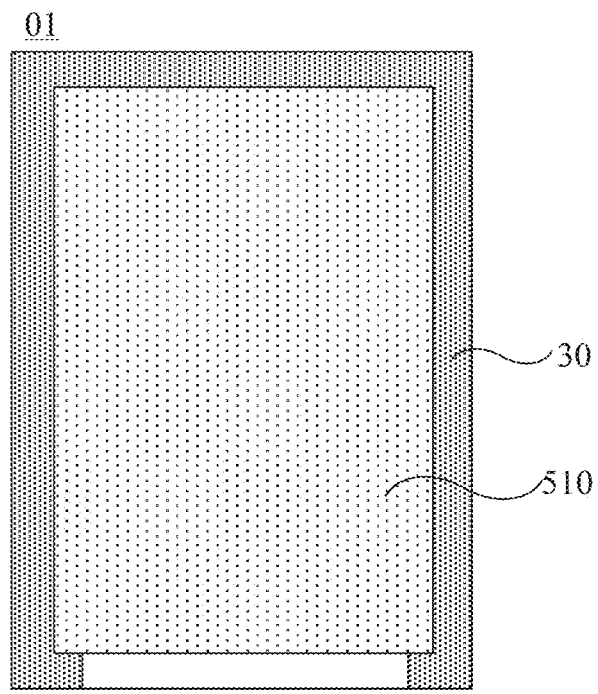
FIG. 5 is a schematic top plan view of a cathode layer and an electrode power supply line in a display panel according to some arrangements of the present disclosure.

For example, as shown in FIG. 5, when the first electrode 51 is a cathode, the whole electrode layer may be a whole layer of cathode layer 510.

Since a whole layer of cathode layer 510 has a large area, in order to avoid a voltage drop, as shown in FIG. 5, the number of the electrode power supply lines 30 coupled to the cathode layer 510 may be one and disposed in the periphery of the cathode layer 510. The periphery includes three sides of the cathode layer 510.

Here, the manner in which the electrode power supply line 30 is coupled to the cathode layer 510 includes, but is not limited to, direct connection by overlapping (i.e., a portion of one is overlaid on a portion of the other); or, the electrode power supply line 30 and the cathode layer 510 may be formed simultaneously in a single process, that is, the two are directly connected together; or the electrode power supply line 30 and the cathode layer 510 may be connected through a via hole, which is not limited in some arrangements of the present disclosure, as long as the voltage on the electrode power supply line 30 can be applied to the cathode layer 510.

Of course, when the cathode layer 510 has a small area, that is, when the possibility of a voltage drop is small, the number of the electrode power supply lines 30 coupled to the cathode layer 510 may be two, and may be disposed respectively on the opposite two sides of the cathode layers 510.

As shown in FIG. 3a or 3b, the driving circuit 20 disposed in the periphery of the display area 100 includes at least one gate driver circuit (GOA) 21 and at least one source driving circuit 22.

The gate driving circuit 21 is configured to provide a corresponding scan signal to each of the sub-pixels 100a, and may be disposed at least one of the opposite sides of the periphery of the display area 100. The source driving circuit 22 is configured to provide a corresponding data signal to each of the sub-pixels 100a, and generally disposed at the side of display area 100 adjacent to the gate driving circuit 21.

The orthogonal projection of the at least one signal line 30 on the base substrate 10 may have an overlapping area with an orthogonal projection of at least one of the at least one gate driver circuit (GOA) 21 and the at least one source driver circuit 22 described above on the base substrate 10.

Here, since the electrode power supply line 30 is required to supply a relatively stable voltage to the whole lay of cathode layer 510, the line width thereof is large, and the size of the area where the GOA is disposed is also large. Therefore, the orthogonal projection of the electrode power supply line 30 on the base substrate 10 may have an overlapping area with an orthogonal projection of at least one of the at least one gate driver circuit (GOA) 21 and the at least one source driver circuit 22 described above on the base substrate 10. That is, the position of the electrode power supply line 30 on one side of the periphery of the display area 100 may correspond to the position of the GOA on that side.

The GOA may be disposed at one side of the periphery of the display area 100 as shown in FIG. 3a; or, the GOA may be disposed at opposite sides of the periphery of the display area 100 as shown in FIG. 3b.

In order to better illustrate the above display panel provided by some arrangements of the present disclosure, the structure of the GOA will be described in detail below.

Figure 6:
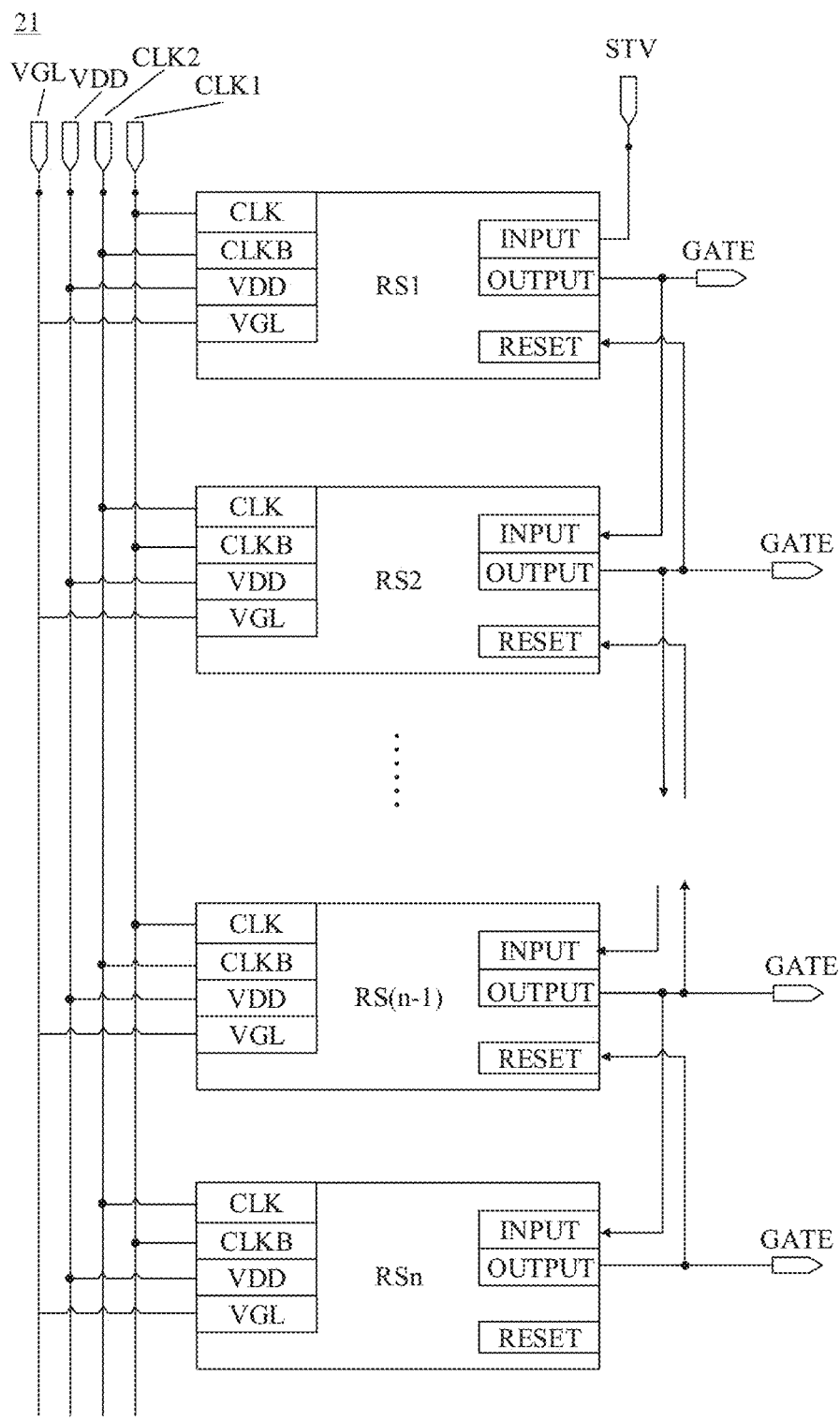
FIG. 6 is a schematic structural diagram of a gate driving circuit of FIG. 3a or 3b.

As shown in FIG. 6, any of the gate driving circuits 21 includes a plurality of cascaded shift register sub-circuits (RS, labeled as RS1, RS2, RSn, respectively, in FIG. 6 for clarity), where n≥2, n is a positive integer.

The output terminal OUTPUT of each shift register sub-circuit RS is coupled to a gate line GATE, and a shift register sub-circuit RS is configured to: control on and off states of each TFT in each pixel circuit in the sub-pixels of the same row.

In this case, under the control of the gate driving circuit 21, the data voltage supplied from the above-described source driving circuit can be output to the second electrode 52 of the light emitting device 50 in each pixel circuit through the data line.

In this way, when a voltage, for example, a voltage VSS, is applied to the first electrode 51, the light emitting layer 53 disposed between the first electrode 51 and the second electrode 52 can be driven to emit light under the action of the electric field between the first electrode 51 and the second electrode 52, thus achieving the purpose of illuminating the light emitting device 50.

Based on this, since the orthogonal projection of the gate driving circuit 21 on the base substrate 10 has an overlapping area with the orthogonal projection of the electrode power supply line 30 on the base substrate 10. In this way, in the manufacturing process of the display panel 01, for example, the fabrication of (one or more) gate driving circuits 21, for example, electronic components such as switches (such as TFTs) and capacitors in the gate drive circuits 21, may be first completed on the above-mentioned base substrate 10. Then, at least one insulating layer 40 covering the gate driving circuit 21 is formed on the base substrate 10 on which the gate driving circuit 21 is formed. Next, on the base substrate 10 having the gate driving circuit 21 and the at least one insulating layer 40, at least one electrode power supply line 30 coupled to the cathode layer 510 is formed, and the orthogonal projection of the at least one electrode power supply line 30 on the base substrate 10 has an overlapping area with the orthogonal projection of the (one or two) gate driving circuits 21 on the base substrate 10.

In this case, the plurality of metal portions in the gate driving circuit 21, including, for example, a gate electrode, a source electrode and a drain electrode of a TFT, a metal trace in the same layer as the gate electrode, and a metal trace in the same layer as the source electrode (and/or the drain electrode), are all disposed in a different layer from that of the electrode power supply line 30 and got insulated, so that the signal line 30 can be prevented from occupying the wiring space in the periphery of the driving circuit 20, so that the wiring space in the periphery of the display area 100 can be further compressed. Moreover, it is not necessary to increase the wiring density of the driving circuit 20 itself.

Figure 7:
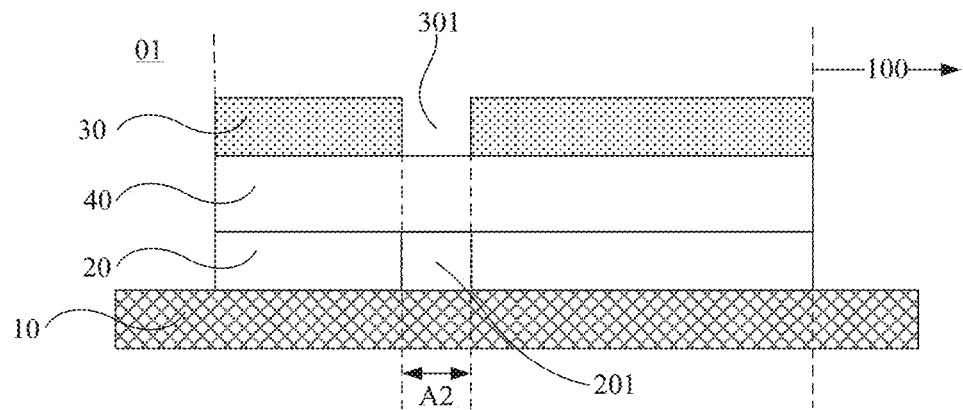
FIG. 7 is a schematic cross-sectional view of a display panel according to some arrangements of the present disclosure.
Figure 8:
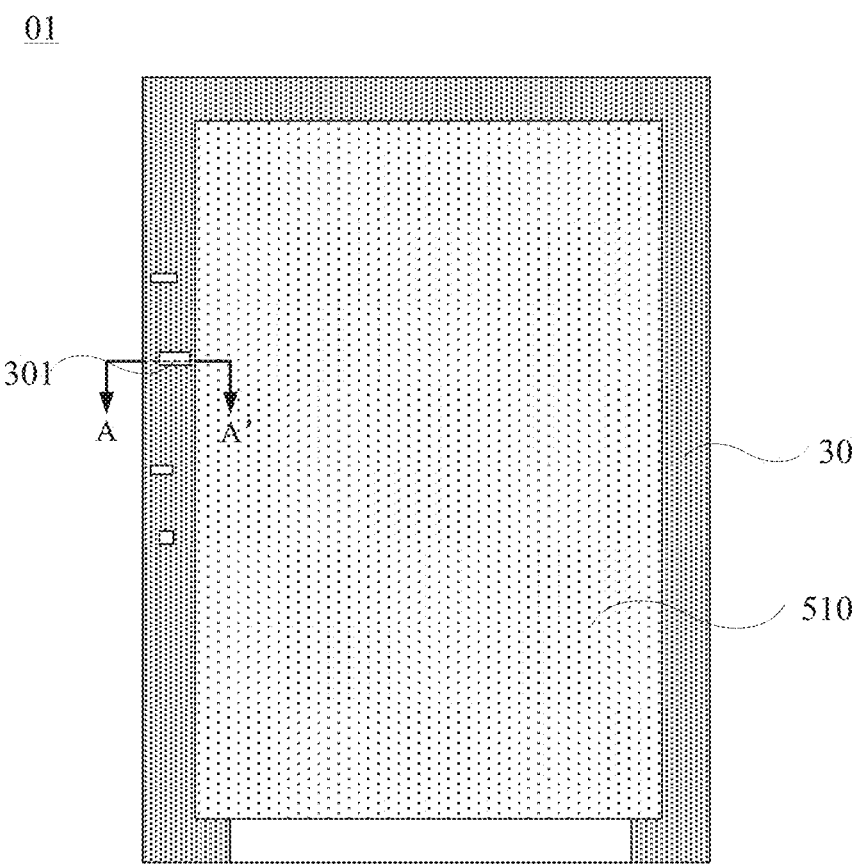
FIG. 8 is a schematic structural diagram of an opening of an electrode power supply line in a display panel according to some arrangements of the present disclosure.

In some arrangements of the present disclosure, as shown in FIGS. 7 and 8, for any of the electrode power supply lines 30 of which the orthogonal projection on the base substrate 10 has an overlapping area with the orthogonal projection of the driving circuit 20 on the base substrate 10, the electrode power supply line 30 is provided with at least one opening 301. The orthogonal projection of at least one of the openings 301 on the base substrate 10 has an overlapping area A2 with the orthogonal projection of at least one metal portion 201 of the driving circuit 20 on the base substrate 10.

Here, the cross-sectional direction of FIG. 7 corresponds to the A-A' direction in FIG. 8.

The shape, the number, and the distribution of the openings 301 are not limited; and the shape, the number, and the distribution of the metal portions 201 in the driving circuit 20 are not limited.

Also, the overlapping area A2 includes, but is not limited to, that shown in FIG. 7, that is, the area of one overlapping area A2 is equal to the area of the orthogonal projection of one metal portion 201 on the base substrate 10, as long as the orthogonal projection of at least one opening 301 on the base substratel 10 and the orthogonal projection of at least one metal portion 201 of the driving circuit 20 on the base substrate 10 may have an overlapping area A2.

In this way, by providing the opening 301 described above, there is no conductive material at the position of the opening 301 on the electrode power supply line 30 (that is, the conductive material at the opening is removed), the facing area of the electrode power supply line 30 with at least one metal portion 201 of the driving circuit 20 can be reduced, thus avoiding or weakening the interference (that is, the coupling effect) of the electrode power supply line 30 with the metal portion 201 in the driving circuit 20.

In some arrangements of the present disclosure, for any of the electrode power supply lines 30 of which the orthogonal projection on the base substrate 10 has an overlapping area with the orthogonal projection of the driving circuit 20 on the base substrate 10, a plurality of openings 301 is provided on the electrode power supply line 30, that is, there are a plurality of openings 301 on the electrode power supply line 30, and an orthogonal projection of each of the openings 301 on the base substrate 10 and the orthogonal projection of at least one metal portion 201 on the base substrate 10 have an overlapping area.

Hereinafter, the manner in which the openings 301 in the electrode power supply line 30 are disposed will be illustrated by taking the gate driving circuit 21 as an example, according to different metal portions 201 in the gate driving circuit 21.

EXAMPLE ONE

When the gate driving circuit 21 includes a plurality of transistor TFTs, the gate electrode (G) of each transistor TFT is taken as one metal portion, and the source electrode (S) of each transistor TFT is taken as one metal portion, and the drain electrode (D) of each transistor TFT is taken as one metal portion.

Figure 9A:
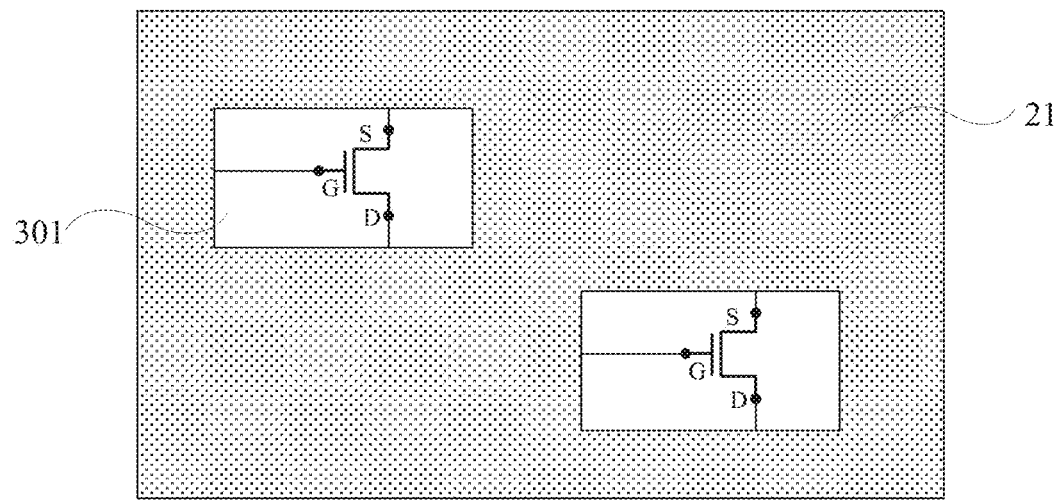
FIG. 9a is a schematic diagram showing an arrangement of the opening of FIG. 8 corresponding to a position of a TFT.
Figure 9B:
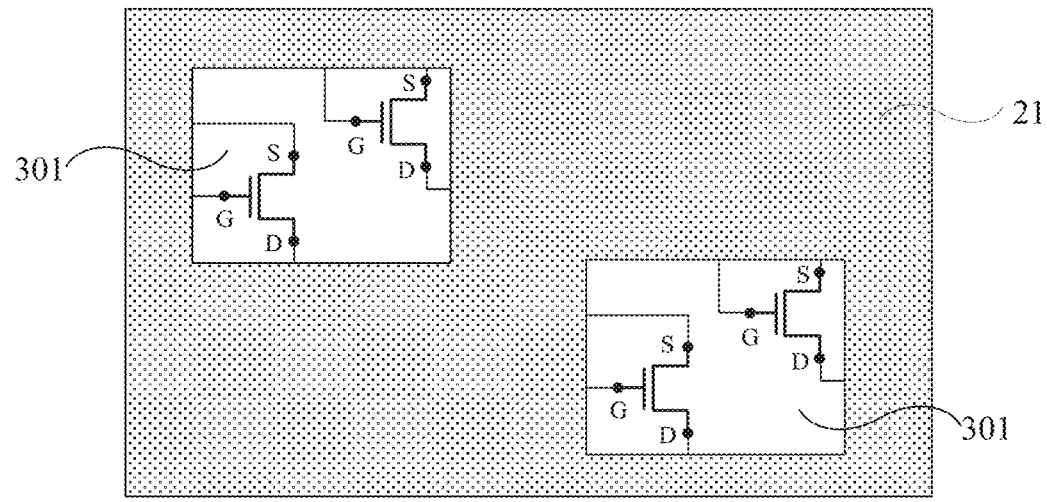
FIG. 9b is a schematic diagram showing another arrangement of the opening of FIG. 8 corresponding to the position of the TFT.
Figure 9C:
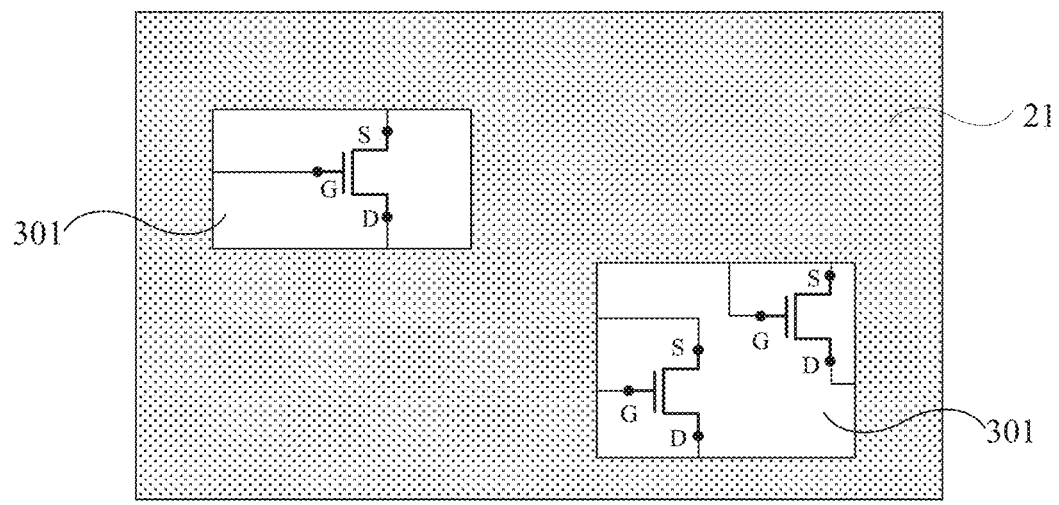
FIG. 9c is a schematic diagram showing still another arrangement of the opening of FIG. 8 corresponding to the position of the TFT.

In this case, as shown in FIGS. 9a to 9c, an opening 301 in the electrode power supply line 30 corresponds to at least one of the gate electrode, the source electrode and the drain electrode of the at least one transistor TFT, that is, an opening 301 corresponds to a position of at least one of the gate electrode, the source electrode and the drain electrode of one transistor TFT.

Since the line width of the electrode power supply line 30 is generally large, it can be regarded as a conductive layer. By providing at least one opening 301 on the electrode power supply line 30, and making the opening 301 corresponding to at least one of the gate electrode, the source electrode and the drain electrode of at least one transistor TFT, it can prevent the voltage applied for a long time on the electrode power supply line 30 from interfering with the channel of the underlying lower transistor TFT when the electrode power supply line 30 is in the voltage-increasing (VSS) state for a long time.

When the transistor TFT is a transistor having relatively large width and length, for example, when the transistor TFT is a driving transistor, interference with the channel can be significantly reduced by providing the opening 301 on the electrode power supply line 30.

As an example of a corresponding manner, as shown in FIG. 9a, each of the openings 301 may correspond to at least one of the gate electrode, the source electrode and the drain electrode of one transistor TFT.

Here, in FIG. 9a, only each opening 301 corresponding to the gate electrode, the source electrode and the drain electrode of one transistor TFT is illustrated as an example. Of course, by adjusting the size and distribution of the openings 301, each opening 301 can be made corresponding to only one of the gate electrode, the source electrode and the drain electrode of one transistor TFT.

As an example of another corresponding manner, as shown in FIG. 9b, each opening 301 may correspond to a plurality of transistor TFTs.

In this case, since one opening 301 corresponds to a plurality of transistor TFTs, the orthogonal projection of one opening 301 on the base substrate 10 covers the orthogonal projection of the plurality of transistor TFTs on the base substrate 10.

As an example of another corresponding manner, as shown in FIG. 9c, among the plurality of openings 301, each of a part of the openings 301 corresponds to at least one of the gate electrode, the source electrode and the drain electrode of one transistor TFT, and each of the other part of the openings 301 corresponds to a plurality of transistor TFTs.

Figure 9D:
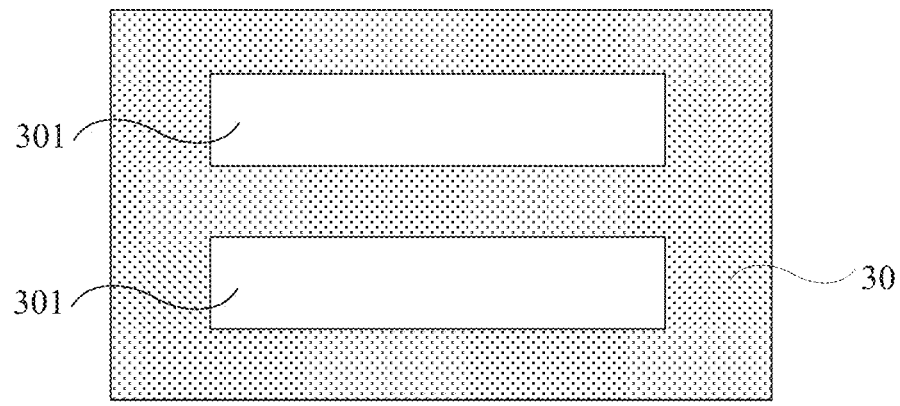
FIG. 9d is a schematic diagram showing the shape of the opening in FIG. 8.

For example, when one opening 301 corresponds to a plurality of transistor TFTs, as shown in FIG. 9d, the opening 301 may have an elongated shape so that the area of the opening 301 is large, and thus the orthogonal projection of the opening 301 on the base substrate 10 can cover the orthogonal projection of the plurality of transistor TFTs on the base substrate 10.

It can be understood that since the source electrode and the drain electrode in the transistor TFT are generally symmetrical in structure and composition, the source electrode and the drain electrode in one transistor are generally treated as exchangeable. In some arrangements of the present disclosure, to distinguish the two electrodes of a transistor other than the gate electrode, one of the electrodes is referred to as a source electrode and the other electrode is referred to as a drain electrode.

In the above-described gate driving circuit 21, each of the shift register sub-circuits includes a driving transistor (DTFT) and a selection transistor (STFT).

The driving transistor has relatively large width and length, and can drive a certain load. Compared to the driving transistor, the selection transistor has relatively small width and length, as long as the signal can be transmitted. For example, after a selection transistor is turned on, it has only to transmit a signal applied on the source electrode (or the drain electrode) to the drain electrode (or source electrode).

Figure 10:
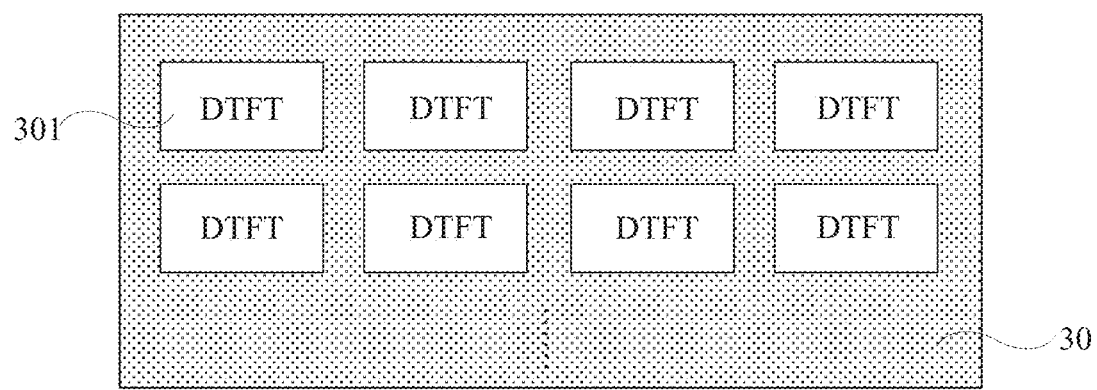
FIG. 10 is a schematic diagram showing still another arrangement of the opening of FIG. 8 corresponding to the position of the TFT.

Based on this, as shown in FIG. 10, each of the openings 301 on the electrode power supply line 30 may correspond to one DTFT.

Figure 11:
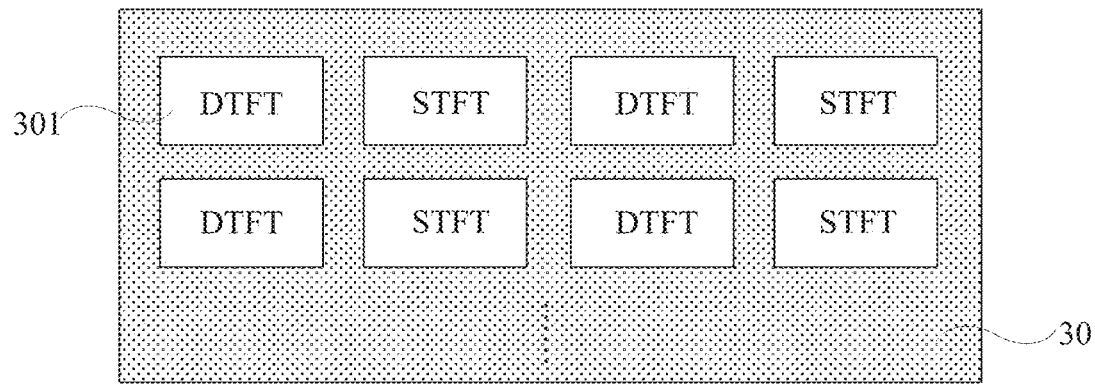
FIG. 11 is a schematic diagram showing still another arrangement of the opening of FIG. 8 corresponding to the position of the TFT.
Figure 12:
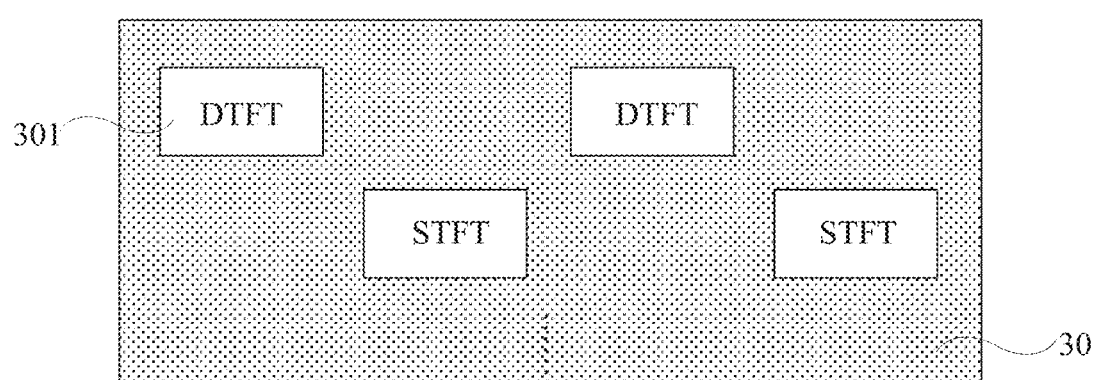
FIG. 12 is a schematic diagram showing still another arrangement of the opening of FIG. 8 corresponding to the position of the TFT.

Alternatively, as shown in FIGS. 11 and 12, a part of the openings 301 on the electrode power supply line 30 corresponds to the DTFTs, and the other part of the openings 301 corresponds to the STFTs.

The positions of the plurality of openings 301 are not limited. As shown in FIG. 10 or FIG. 11, the plurality of openings 301 are aligned in the lateral or longitudinal direction, or, as shown in FIG. 12, the plurality of openings 301 are staggered in the horizontal or vertical direction.

EXAMPLE TWO

When the gate driving circuit 21 includes at least one metal trace, one metal trace is taken as one metal portion.

Here, as shown in FIG. 6, the gate driving circuit 21 generally includes a plurality of metal traces, and the plurality of metal traces include:
- a start signal line (STV) coupled to the first stage shift register sub-circuit RS1, a clock signal line (Clock including CLK1 and CLK2) coupled to each shift register sub-circuit RS, and a power supply voltage signal line (Voltage Device, VDD), and a shutdown voltage signal line (Vgatelow, VGL), among others.

Figure 13:
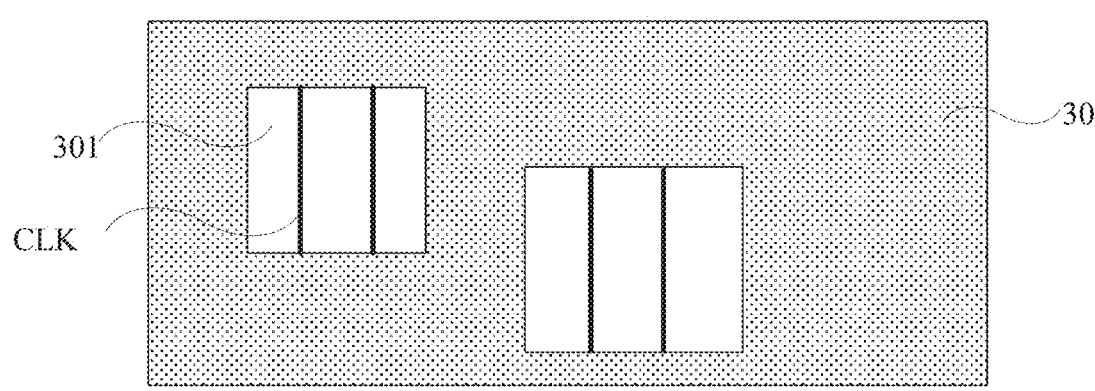
FIG. 13 is a schematic diagram showing an arrangement of the opening of FIG. 8 corresponding to a position of a metal trace.

In this case, as shown in FIG. 13, one opening 301 corresponds to at least a portion of at least one metal trace (e.g., CLK), that is, the position of one opening 301 corresponds to at least a portion of at least one metal trace.

Since the line width of the electrode power supply line 30 is generally large, it can be regarded as a conductive layer. By providing at least one opening 301 on the electrode power supply line 30, and making the opening 301 corresponding to at least a portion of at least one metal trace, it can reduce the coupling effect between the electrode power supply line 30 and the underlying metal trace when the electrode power supply line 30 is in a voltage-applying (VSS) state for a long time.

For example, it can reduce the parasitic capacitance generated between the electrode power supply line 30 and the underlying metal trace, thus preventing a delay (i.e., signal attenuation) of a signal (e.g., an AC signal) transmitted on the metal trace, thus ensuring the normal operation of the gate driving circuit 21. It can reduce the effect of the voltage on the electrode power supply line 30 on signals (e.g., AC signals) transmitted on the metal traces, thus avoiding excessive heating of the metal traces and causing damage.

The shape, the number, and the distribution of the openings 301 provided in the electrode power supply line 30 can correspond to the underlying metal traces as much as possible while maintaining the conductivity of the electrode power supply line 30, in order to reduce the coupling effect described above.

Figure 14:
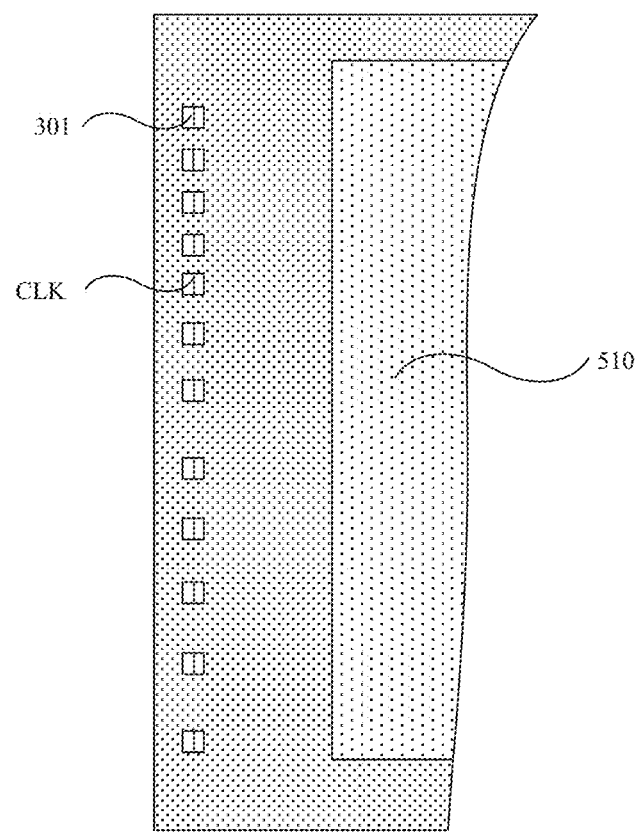
FIG. 14 is a schematic diagram showing another arrangement of the opening of FIG. 8 corresponding to the position of the metal trace.

For example, as shown in FIG. 14, at least one metal trace (for example, CLK) corresponds to a plurality of openings 301. The total size of the overlapping area of the orthographic projection of the plurality of openings 301 corresponding to the same metal trace on the base substrate 10 and the orthographic projection of the metal trace on the base substrate 10, is larger than or equal to 20% of the area of the orthogonal projection of the metal trace on the base substrate 10.

For example, while the conductivity of the electrode power supply line 20 is maintained excellent, the total size of the overlapping area of the orthographic projection of the plurality of openings 301 corresponding to the same metal trace on the base substrate 10 and the orthographic projection of the metal trace on the base substrate 10, is equal to 80% or 90% of the area of the orthogonal projection of the metal trace on the base substrate 10.

The distribution of the plurality of openings 301 corresponding to the same metal trace is not limited.

For example, the plurality of openings 301 corresponding to the same metal trace may be continuously distributed, in which case the spacing between adjacent two openings 301 is small. Alternatively, the plurality of openings 301 corresponding to the same metal trace may be scattered, in which case the spacing between adjacent two openings 301 is large.

It can be understood that when the gate driving circuit 21 includes the plurality of transistor TFTs and the plurality of metal traces, the gate electrode of each transistor TFT is taken as one metal portion, and the source electrode of each transistor TFT is taken as one metal portion, and the drain electrode in each transistor TFT is taken as one metal portion, and each metal trace is also taken as one metal portion.

In this case, an opening 301 in the electrode power supply line 30 may correspond to the position of the transistor TFT or correspond to the position of the metal trace, and an opening 301 may correspond to the position of the transistor TFT and the position of the metal trace.

It should be noted that each of the above openings 301 is exemplified by a rectangular opening (that is, the cross section of the opening in a direction parallel to the base substrate is rectangular), and some arrangements of the present disclosure do not limit the shape of the opening, it may be a rectangular opening as described above, or a circular opening (that is, the cross section of the opening is circular), a triangular opening (that is, the cross section of the opening is triangular), and a rhombus opening (that is, the opening of the opening is a rhombus shape) and irregular shaped opening (that is, the cross section of the opening is irregular).

As can be seen from the above description, in order to insulate the respective metal portions of the gate driving circuit 21 from the electrode power supply line 30, as shown in FIG. 2, at least one insulating layer 40 is disposed between the gate driving circuit 21 and the electrode power supply line 30.

Here, the at least one insulating layer 40 may include at least one organic insulating layer and/or at least one inorganic insulating layer.

The manner in which the at least one insulating layer 40 is disposed will be exemplified below.

Figure 17:
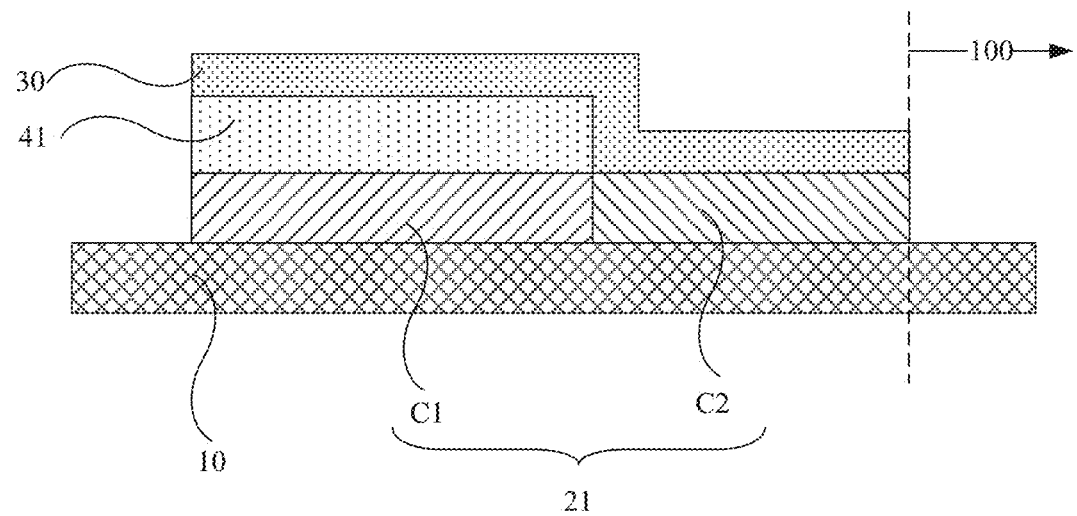
FIG. 17 is a schematic diagram showing still another arrangement of at least one insulating layer in FIG. 5.

In some arrangements of the present disclosure, as shown in FIG. 17, the at least one insulating layer 40 may include an organic insulating layer 41.

The organic insulating layer 41 may be a planarization layer (PLN) mainly composed of a resin material.

The thickness of the organic insulating layer 41 may be 500 nm to 5000 nm. This numerical range enables the organic insulating layer 41 to have superior planarization and insulating effects, and at the same time to satisfy the requirements of the ultra-thin design of the display panel 01.

For example, the organic insulating layer 41 may have a thickness of 800 nm to 2000 nm.

Figure 18:
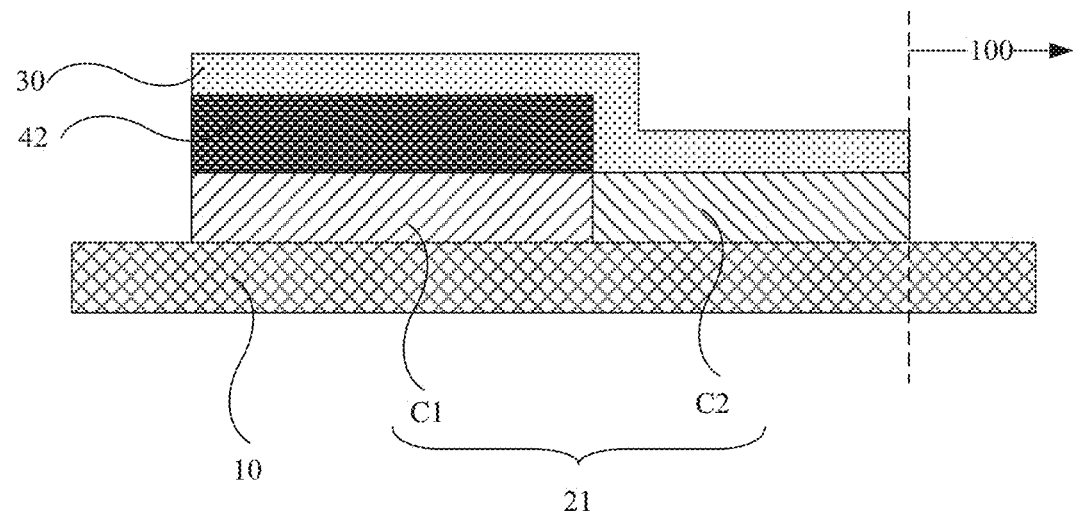
FIG. 18 is a schematic diagram showing still another arrangement of at least one insulating layer in FIG. 5.

In some arrangements of the present disclosure, as shown in FIG. 18, the at least one insulating layer 40 may include an inorganic insulating layer 42.

The inorganic insulating layer 42 may be a passivation layer (PVX) mainly composed of a silicon nitride and/or silicon oxynitride material.

The inorganic insulating layer 42 may have a thickness of 100 nm to 500 nm. This numerical range enables the inorganic insulating layer 42 to have a superior insulating effect and at the same time to satisfy the requirements of the ultra-thin design of the display panel 01.

For example, the inorganic insulating layer 42 may have a thickness of 150 nm to 300 nm.

Figure 19:
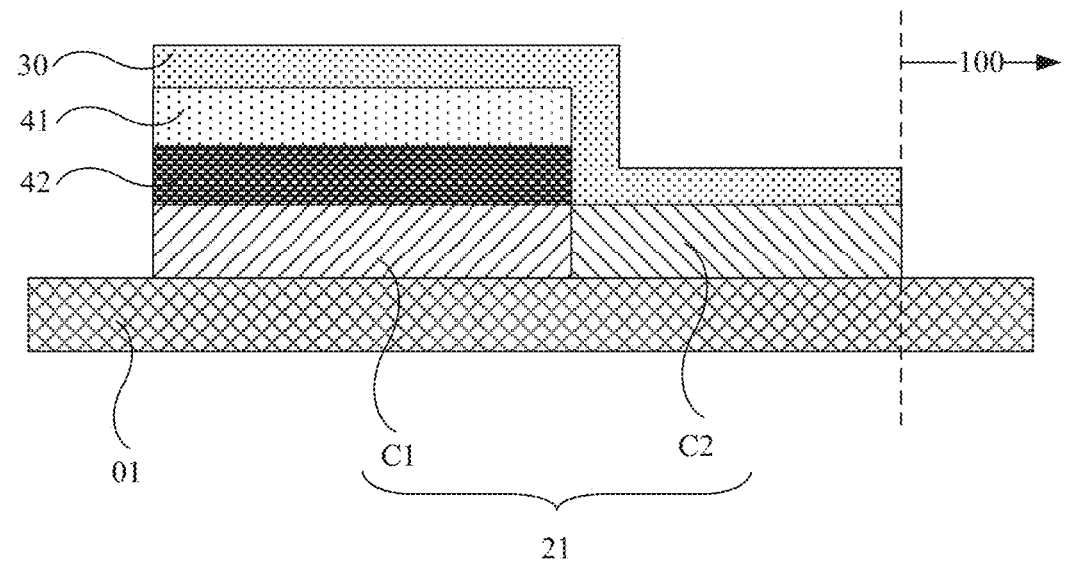
FIG. 19 is a schematic diagram showing still another arrangement of at least one insulating layer in FIG. 5.

In some arrangements of the present disclosure, as shown in FIG. 19, the at least one insulating layer 40 may include an organic insulating layer 41 and an inorganic insulating layer 42.

The inorganic insulating layer 42 is disposed adjacent to the gate driving circuit 21, and the organic insulating layer 41 is adjacent to the electrode power supply line 30.

In this way, since the inorganic insulating layer 42 is more densely structured, the gate driving circuit 21 can be better protected by the inorganic insulating layer 42 to block water vapor or oxygen from entering the gate driving circuit 21, thus avoiding affecting the performance of the gate driving circuit 101.

Here, when at least one insulating layer 40 includes an organic insulating layer 41 and an inorganic insulating layer 42, the thicknesses of the organic insulating layer 41 and the inorganic insulating layer 42 can be set with reference to the above numerical range, and details are not described herein again.

On the basis of the above, since the manufacturing method of the organic insulating layer 41 is simpler than the manufacturing method of the inorganic insulating layer 42, it can be provided as follows:

the thickness of the organic insulating layer 41 is made larger than the thickness of the inorganic insulating layer 42, so that the spacing between the respective metal portions in the gate driving circuit 21 and the above-described electrode power supply line 30 can be increased by the organic insulating layer 41, thus further reducing the coupling effect between the electrode power supply line 30 and the respective metal portions, and further reducing the influence of the coupling effect on the TFTs in the gate driving circuit 21 and the transmission signal.

Figure 15:
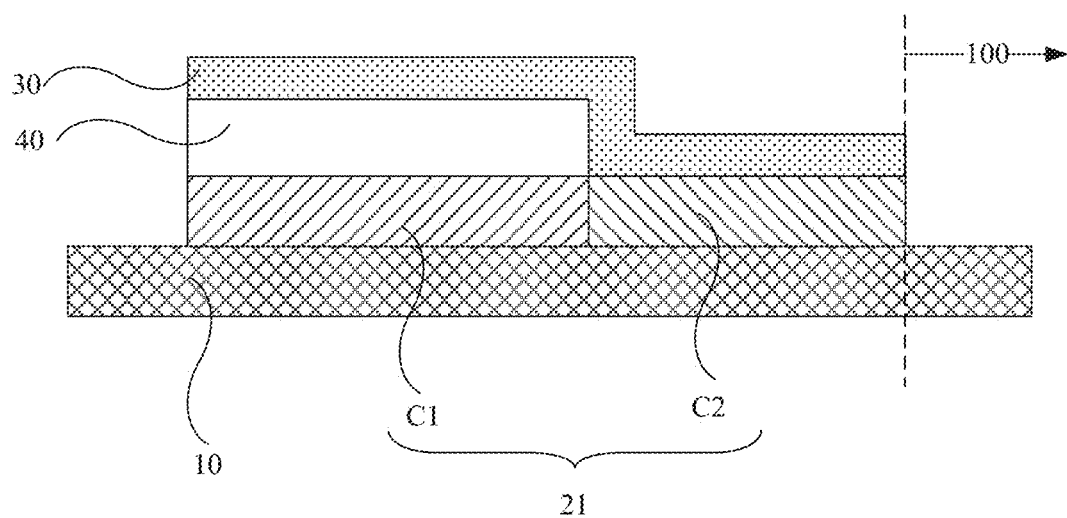
FIG. 15 is a schematic diagram showing an arrangement of at least one insulating layer in FIG. 5.
Figure 16:
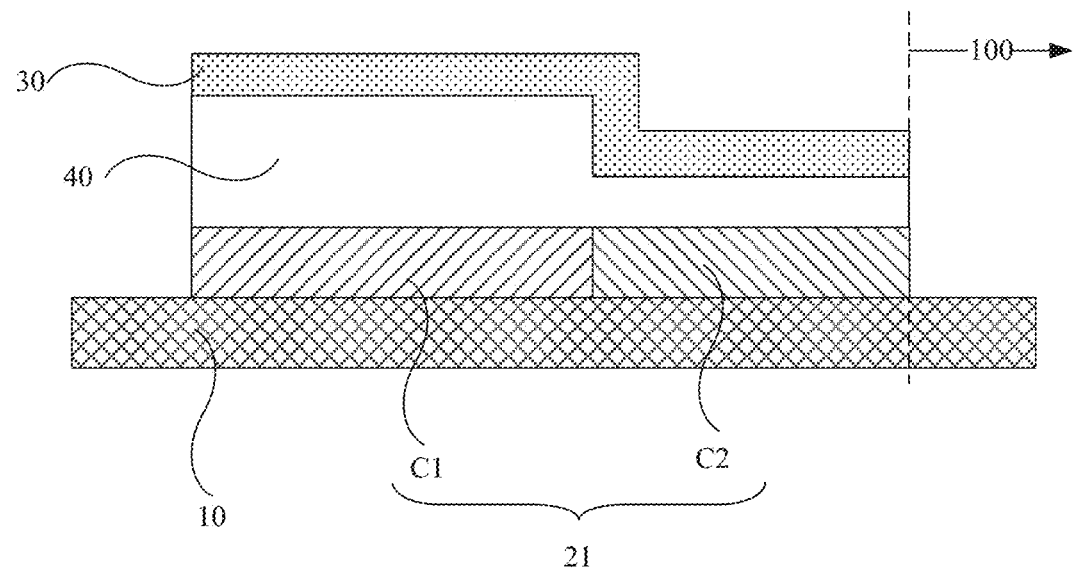
FIG. 16 is a schematic diagram showing another arrangement of at least one insulating layer in FIG. 5.

On the basis of this, as shown in FIGS. 15 and 16, the driving circuit (for example, the gate driving circuit 21) has a first region C1 and the second region C2 outside the first region C1, and the metal portions in the gate driving circuit 21 are disposed in the first region C1.

As shown in FIG. 15, all of the insulating layer 40 corresponds to the first region C1; or, as shown in FIG. 16, the whole insulating layer 40 corresponds to the first region C1 and the second region C2, and the thickness of the portion of the whole insulating layer 40 corresponding to the first region C1 is larger than the thickness of the portion of the whole insulating layer 40 corresponding to the second region C2.

Since all of the insulating layer 40 is disposed only in the first region C1, or portions of the whole insulating layer 40 corresponding to the first region C1 and corresponding to the second region C2 have different thicknesses, when the above-described electrode power supply line 30 is formed over the whole insulating layers 40, the surface of electrode power supply line 30 away from the base substrate 10 will be uneven.

Thus, when subsequently a film is formed on the surface of the electrode power supply line 30 away from the base substrate 10, the film maintains the uneven shape described above. In this way, in the film packaging process, when inkjet printing (IJP) process is employed to form the organic encapsulation layer 61 in the TFE layer 60 shown in FIG. 4, due to the fluidity of the organic material, during the process of leveling the organic encapsulation layer 61, the convex portion of the electrode power supply line 30 on the side away from the base substrate 10 may block the leveling of the organic encapsulation layer 61, thus functioning as a dam. It can achieve an object of prevent the organic encapsulation layer 61 from flowing out of the preset area (the preset area usually includes the display area and slightly exceeds the display area).

Taking the whole insulating layer 40 only disposed in the first region C1 as an example, as shown in FIGS. 17-19, the insulating layer 40 may include an organic insulating layer 41 and/or an inorganic insulating layer 42.

The thicknesses of the organic insulating layer 41 and the inorganic insulating layer 42 can be set with reference to the above numerical range, and details are not described herein again.

Figure 20:
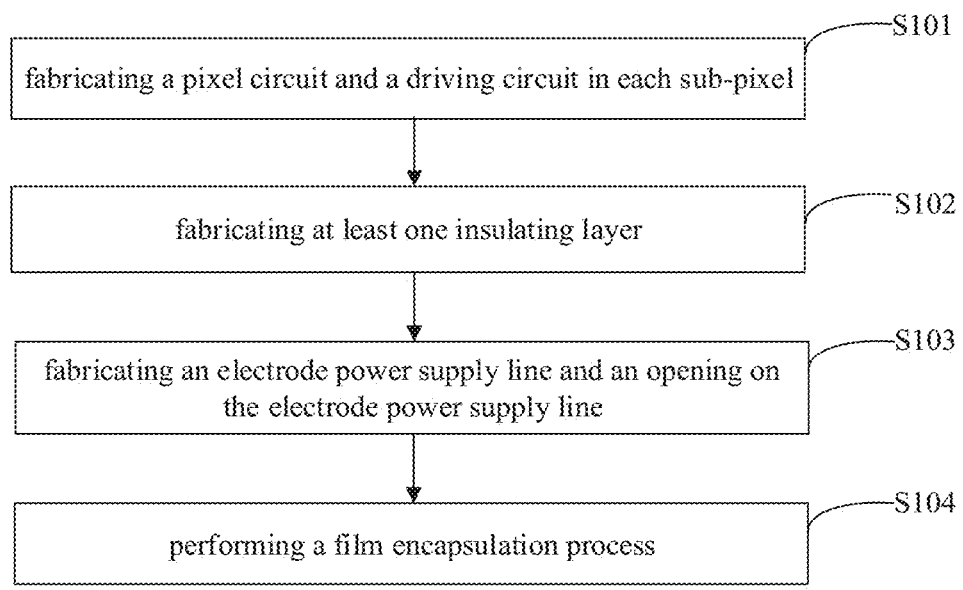
FIG. 20 is a flowchart of a manufacturing process of a display panel according to some arrangements of the present disclosure.

Hereinafter, the manufacturing process of the display panel 01 will be described by taking the structure shown in FIG. 19 as an example. As shown in FIG. 20, the manufacturing process includes blocks 101-104 (S101-S104).

In block S101, a pixel circuit and a driving circuit (including, for example, a gate driving circuit) in each sub-pixel are fabricated.

By way of example, each of the pixel circuits and the transistor TFTs in the gate driving circuit can be fabricated in the following manner.

Figure 21:
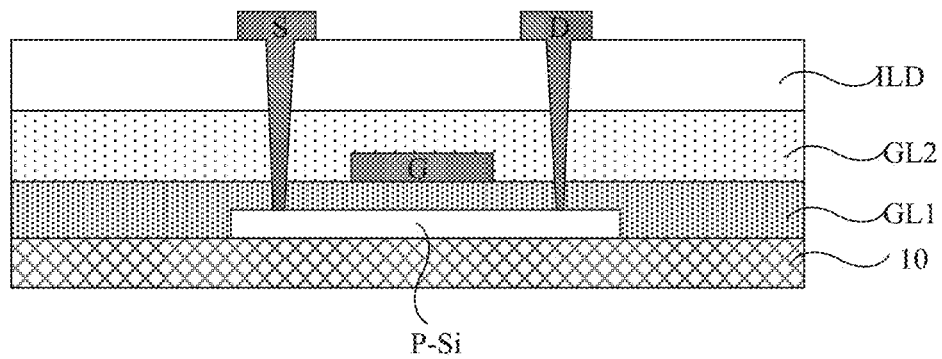
FIG. 21 is a cross-sectional view of a portion of a TFT in a display panel according to some arrangements of the present disclosure.

As shown in FIG. 21, on the base substrate 10, an active layer of a transistor TFT (for example, polysilicon, denoted as P—Si in FIG. 21), a gate electrode (G), a source electrode (S), a drain electrode (D) and the like are formed by a patterning process.

An insulating layer is formed between the gate electrode (G) and the active layer, and the insulating layer is, for example, a first gate insulating layer (Gate Insulating layer 1, GL1).

An insulating layer is formed between the gate electrode (G) and the source electrode (S)/the drain electrode (D), and the insulating layer includes a second gate insulating layer (GL2) and/or an interlayer dielectric layer (Inter Layer Dielectric, ILD).

By way of example, the capacitance in each pixel circuit and gate driving circuit can be made in the following manner.

While fabricating the gate electrodes, one electrode of each capacitor is fabricated; while the source electrodes and the drain electrodes are fabricated, the other electrodes of each capacitor are fabricated.

Thus, the second gate insulating layer GL2 and/or the interlayer dielectric layer ILD can isolate the opposite two electrodes in each capacitor, thus forming the capacitors in the corresponding circuits.

Moreover, in the process of fabricating the source electrode (S) and the drain electrode (D), the metal traces in the gate driving circuit, such as the CLK trace, can be fabricated by one patterning process.

It should be noted that, in some arrangements of the present disclosure, the so-called patterning process refers to a process for forming a predetermined pattern.

The process may include: a photolithography process, or a photolithography process and an etching process.

The photolithography process refers to a process of forming a photoresist pattern by using a photoresist, a mask, an exposure machine, or the like, including a plurality of steps of film formation, exposure, and development.

Of course, the above-mentioned patterning process may also include other processes such as printing, inkjet, and the like. As long as a predetermined pattern can be formed, the corresponding patterning process may be selected according to the structure to be formed in the above display panel 01 provided by some arrangements of the present disclosure.

By way of example, the one-time patterning process in some arrangements of the present disclosure specifically includes a photolithography process (i.e., using a mask for one time) and at least one etching process. A desired photoresist pattern is formed by the photolithography process, and the film underlying the photoresist pattern is etched by the etching process to form the desired structure and remove (e.g., by an ashing process) the photoresist pattern.

In block S102, at least one insulating layer is fabricated.

By way of example, as shown in FIG. 19, on the base substrate 10 on which the source electrode (S) and the drain electrode (D) are formed, an inorganic insulating layer 42 and an organic insulating layer 41 are formed.

The materials and thicknesses of the inorganic insulating layer 42 and the organic insulating layer 41 are set as described above, and are not described herein again.

In this case, in order to enable the at least one insulating layer 40 to electrically isolate the gate driving circuit and the electrode power supply line, the organic encapsulation layer in the TFE layer blocks during the leveling process, and when a layer of the inorganic insulating film is formed, the portion of the inorganic insulating film corresponding to the second region may be removed or thinned, so that the inorganic insulating layer 42 formed of the inorganic insulating film only corresponds to the first region, or the thickness of the portion of the formed inorganic insulating layer 42 corresponding to the first region is larger than the thickness of the portion corresponding to the second region.

Similarly, when an organic insulating film is formed, a portion of the organic insulating film corresponding to the second region may be removed or thinned, so that the organic insulating layer 41 formed of the organic insulating film only corresponds to the first region, or the thickness of the portion of the formed organic insulating layer 41 corresponding to the first region is larger than the thickness of the portion corresponding to the second region.

For example, a semi-transparent mask (Halftone) can be used in the process of removing or thinning.

As is apparent from the above description, since the organic insulating layer 41 and the inorganic insulating layer 42 have different thicknesses in different regions (or only correspond to one region), an uneven surface is formed. The convex portion of the electrode power supply line 30 formed thereafter on the side away from the base substrate 10 blocks the leveling of the above-described organic encapsulation layer, thus functioning as a dam.

Moreover, when the thickness of each of the insulating layers is increased in the first region, the influence of the electrode power supply line 30 on the TFT and the metal trace in the gate driving circuit can be effectively reduced.

In block S103, an electrode power supply line and an opening on the electrode power supply line are fabricated.

Here, from the capacitance formula:

$$C = \frac{\varepsilon S}{4\pi k d};$$

where $\varepsilon$ is a constant, S is the facing area of the two electrodes in the capacitor, d is the distance between the two electrodes in the capacitor, and k is the electrostatic constant. It can be seen that the thickness of the insulating layer between the electrode power supply line 30 and the gate driving circuit can be increased, to reduce the parasitic capacitance generated between the electrode power supply line 30 and the metal portions in the gate driving circuit, thus reducing the coupling effect of the electrode power supply line 30 on the gate driving circuit.

Thus, the size of the opening 301 can be appropriately reduced, and/or the number of the openings 301 can be reduced, so that the electrode power supply line 30 can still maintain a good conduction state.

For example, a metal layer may be deposited on the base substrate 10 on which the at least one insulating layer 40 is formed, and the material of the metal layer may be the same as the material for making the source electrode and the drain electrode. Of course, the material of the metal layer can also be the same material as the gate electrode.

Thereafter, a patterning process is performed on the metal layer to form the opening 301.

The opening 301 can correspond to the position of the TFT in the gate driving circuit and/or the metal trace. The specific setting can refer to the above description, and details are not described herein again.

It should be noted that the opening 301 corresponding to the position of the TFT and the opening 301 corresponding to the metal trace may be fabricated by one patterning process or by two patterning processes respectively, which is not limited in some arrangements of the present disclosure.

In this way, through the opening 301, the conductive material above the TFT and/or the metal trace in the gate driving circuit can be removed, thus reducing the effect of the electrode power supply line 30 fabricated above the gate drive circuit on the TFT in the underlying gate drive circuit and the signal transmission on the metal trace In block S104, a film encapsulation process is performed.

For example, the TFE layer formed by the thin film encapsulation process may include two inorganic encapsulation layers and one organic encapsulation layer, and the organic encapsulation layer is disposed between the two inorganic encapsulation layers.

In this way, by utilizing the structural compactness of the inorganic encapsulation layer, water vapor and oxygen can be more effectively isolated; and the fluidity of the organic encapsulation layer can make the overall flatness of the formed TFE layer better.

It should be noted that, in the above manufacturing process, only taking the formed transistor TFT being a top gate type (i.e., the gate electrode is disposed on the side of the active layer away from the base substrate) as an example, and some arrangements of the present disclosure are not limited thereto, each or part of the transistor TFTs in each circuit may also be a bottom gate type, that is, the gate electrode is disposed on the other side of the active layer adjacent to the base substrate, and a transistor TFT having a corresponding structure may be fabricated according to actual needs.

Moreover, the above manufacturing process is only as an example in which at least one insulating layer 40 shown in FIG. 19 includes an inorganic insulating layer 42 and an organic insulating layer 41, when the insulating layer is provided as shown in FIG. 17 or as shown in FIG. 18, corresponding adjustment is required only in the block S102, and details are not described herein again.

Figure 22:
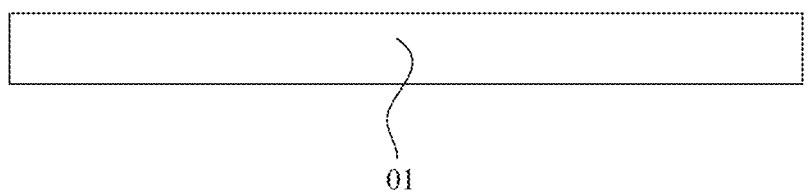
FIG. 22 is a schematic structural diagram of a display device according to some arrangements of the present disclosure.

Some arrangements of the present disclosure also provide a display device, as shown in FIG. 22, which includes the display panel 01 provided by any of the arrangements described above.

The display device 02 has the same technical effects as the display panel 01 provided in the above arrangements, and details are not described herein again.

It is to be understood that, as an illustration, in FIG. 22, the display panel 01 is represented by a single layer, and the specific structure in the display panel 01 is not depicted. For the specific structure, reference may be made to the above description, and details are not described herein again.

The above display device may be any product or component having a display function such as a display, a television, a digital photo frame, a mobile phone or a tablet computer.

The above is only the specific arrangement of the present disclosure, but the scope of the present disclosure is not limited thereto, and any person skilled in the art can easily think of changes or substitutions within the technical scope of the disclosure. It should be covered within the scope of protection of the present disclosure. Therefore, the scope of protection of the present disclosure should be determined by the scope of the claims.

What is claimed is:

1. A display panel, comprising:
   a display area and a base substrate;
   a driving circuit disposed on the base substrate, and comprising a plurality of transistors;
   at least one signal line on the base substrate; and
   at least one insulating layer between the driving circuit and the at least one signal line, wherein an orthogonal projection of the at least one signal line on the base substrate has an overlapping area with an orthogonal projection of the driving circuit on the base substrate;
   wherein the at least one signal line is at least one electrode power supply line, and the at least one electrode power supply line comprises at least one first opening, and an area of an orthogonal projection of each opening of the at least one first opening on the base substrate, is larger than an area of an orthogonal projection of a group of transistors among the plurality of transistors on the base substrate, the group of transistors comprises at least two transistors, and an overlapping area, between an orthogonal projection of an non-opening area of the at least one electrode power supply line on the base substrate and an orthogonal projection of any transistor on the base substrate, is zero;
   wherein the driving circuit comprises a plurality of metal traces;
   the at least one electrode power supply line further comprises at least one second opening, and when the at least one second opening comprises a plurality of openings, one or more openings among the plurality of openings correspond to a same metal trace; and wherein
   an overlapping area, of orthographic projections of the one or more openings on the base substrate and an orthographic projection of the same metal trace on the base substrate, is a first area, an area of the orthographic projection of the same metal trace on the base substrate is a second area, and the first area is at least 20% of the second area.

2. The display panel according to claim 1, wherein:
   the plurality of transistors comprise a driving transistor and a selection transistor; and
   the at least one electrode power supply line further comprises at least one third opening, and the at least one third opening comprises two openings, one opening of the at least one third opening corresponding to the driving transistor and another one opening of the at least one third opening corresponding to the selection transistor.

3. The display panel according to claim 1, wherein:
   the display panel further comprises a plurality of light emitting devices disposed in the display area;
   a first electrode of each of the plurality of light emitting devices is coupled to the at least one electrode power supply line; and
   the first electrode is an electrode of the light emitting device away from the base substrate.

4. The display panel according to claim 3, wherein the first electrodes of the plurality of light emitting devices are connected to each other to form an electrode layer, and the at least one electrode power supply line is coupled to the electrode layer.

5. The display panel according to claim 1, wherein the first area is 80% or 90% of the second area.

6. The display panel according to claim 3, wherein the driving circuit, the at least one insulating layer, and the at least one electrode power supply line are sequentially stacked on the base substrate.

7. The display panel according to claim 3, wherein the at least one insulating layer comprises: at least one of an organic insulating layer or an inorganic insulating layer.

8. The display panel according to claim 7, wherein:
   the at least one insulating layer comprises: one organic insulating layer and one inorganic insulating layer, and
   the inorganic insulating layer is disposed adjacent to the driving circuit, and the organic insulating layer is disposed adjacent to the at least one signal line.

9. The display panel according to claim 8, wherein the organic insulating layer has a thickness larger than a thickness of the inorganic insulating layer.

10. The display panel according to claim 1, wherein the base substrate is a flexible substrate.

11. The display panel according to claim 1, wherein:
    the driving circuit comprises an active layer, a gate electrode layer, and a source/drain electrode layer;
    the at least one insulating layer is between the source/drain electrode layer and the at least one signal line; and
    the at least one signal line is on the source/drain electrode layer and a material of the at least one signal line is same as a material of the source/drain electrode layer.

* * * * *